(12) United States Patent
Yamazaki et al.

(10) Patent No.: US 8,338,903 B2
(45) Date of Patent: Dec. 25, 2012

(54) PHOTOELECTRIC TRANSDUCER AND MANUFACTURING METHOD THEREFOR

(75) Inventors: Tsutomu Yamazaki, Osaka (JP); Satoshi Okamoto, Osaka (JP); Jumpei Imoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 149 days.

(21) Appl. No.: 12/742,319

(22) PCT Filed: Oct. 30, 2008

(86) PCT No.: PCT/JP2008/069768
§ 371 (c)(1),
(2), (4) Date: May 11, 2010

(87) PCT Pub. No.: WO2009/063754
PCT Pub. Date: May 22, 2009

(65) Prior Publication Data
US 2010/0252903 A1 Oct. 7, 2010

(30) Foreign Application Priority Data
Nov. 12, 2007 (JP) .................. 2007-293350

(51) Int. Cl.
*H01L 29/72* (2006.01)
(52) U.S. Cl. ........ 257/459; 257/466; 257/622; 257/774; 438/80; 438/98; 438/421; 438/690
(58) Field of Classification Search .............. 257/459, 257/466, 622, 774; 438/80, 98, 421, 690
See application file for complete search history.

(56) References Cited

U.S. PATENT DOCUMENTS
4,131,984 A * 1/1979 Kaplow et al. .................. 438/80

FOREIGN PATENT DOCUMENTS
| JP | 02-051282 | 2/1990 |
| JP | 06-037343 | 2/1994 |
| JP | 2002-500825 | 1/2002 |
| JP | 2007-521668 | 8/2007 |
| WO | WO 2006/029250 | 3/2006 |

OTHER PUBLICATIONS
International Search Report for PCT/JP2008/069768, mailed Feb. 10, 2009.

* cited by examiner

*Primary Examiner* — Edward Wojciechowicz
(74) *Attorney, Agent, or Firm* — Nixon & Vanderhye P.C.

(57) ABSTRACT

The surrounding length of a junction separation portion can be shortened to improve an insulating resistance in order to provide a solar cell with highly efficiency.
In a photoelectric transducer of the type where a light-receiving surface electrode is wired to another electrode on a back surface via a through electrode passing through a semiconductor substrate of a first conductive type, the photoelectric transducer comprises: a junction separation portion made around the through electrode on a back surface of the semiconductor substrate; a dielectric layer formed for covering the junction separation portion, the through electrode penetrating the dielectric layer; and a back electrode provided on the dielectric layer and coupled to the through electrode which is connected to the light-receiving surface electrode.

7 Claims, 5 Drawing Sheets

PHOTOELECTRIC TRANSDUCER AND MANUFACTURING METHOD THEREFOR

This application is the U.S. national phase of International Application No. PCT/JP2008/069768 filed 30 Oct. 2008, which designated the U.S. and claims priority to JP Application No. 2007-293350 filed 12 Nov. 2007, the entire contents of each of which are hereby incorporated by reference.

TECHNICAL FIELD

The technology presented herein relates to a photoelectric transducer and a manufacturing method therefor, and, more particularly, to a photoelectric transducer of the type where a light-receiving surface electrode is wired to a back surface via a through-hole formed in a semiconductor substrate.

BACKGROUND AND SUMMARY

Recently, a photoelectric transducer for directly converting solar energy into electric energy, the so-called solar cell, has been highly expected as a future-generation energy source in the point of view of problems on earth environment. The photoelectric transducer to be utilized as the solar cell has various types such as those using a composite semiconductor or an organic material, but the mainstream today is of the type using a silicon crystal. An amorphous silicon or a poly-crystal silicon may be widely utilized.

FIG. 5 shows schematically a sectional view of an example of a conventional solar cell. In the conventional solar cell, a n+ layer 11 is formed on a light-receiving surface of a p-type silicon substrate 10 as a semiconductor substrate so as to make a pn junction formed by the p-type silicon substrate 10 and the n+ layer 11. On a first principal surface constituting the light-receiving surface of the p-type silicon substrate 10, there are generated an antireflection film 12 and a silver electrode 13, respectively. Besides, the silver electrode 13 includes a bus bar electrode to be connected to an inter-connector, and a finger electrode extending from the bas bar electrode.

Further, a p+ layer 15 is generated on a second principal surface opposed to the light-receiving surface of the p-type silicon substrate 10. An aluminum electrode 14, and a silver electrode 16 which is connected to the inter-connector, are generated on the back surface of the p-type silicon substrate 10, respectively.

However, in the conventional structure as above, there are problems that an incident light beam may be disturbed by the silver electrode 13, the bus bar electrode, and the finger electrode on the first principal surface to thereby cause a loss by a shadow, and, in addition, carrier re-combination loss may occur under the silver electrode 13. Therefore, it may be necessary that a surface-area factor of the silver electrode 13, the bus bar electrode, and the finger electrode on the first principal surface be small as much as possible.

Then, in order to reduce the surface-area factor of the silver electrode 13 on the first principal surface, and, in addition, to prevent the carrier re-combination loss under the silver electrode 13, a Metal Wrap Through (MWT)-type solar cell as shown schematically in a sectional view of FIG. 6 has been proposed.

In the MWT-type solar cell, a through electrode 19 passing through a through-hole preliminarily penetrated in the silicon substrate 10 causes a part of a silver electrode 17 on a first principal surface to be wired to a silver electrode 18 of a second principal surface. According to such a structure, a surface-area factor of the silver electrode 17 on the first principal surface can be reduced.

In such a solar cell, it is necessary that the silver electrode 18 coupled on the second principal surface which is wired by the silver electrode 17 on the first principal surface and the through electrode 19, be electrically isolated from an aluminum electrode 14 on the second principal surface. Therefore, as proposed in the document 1 below, an n+ layer 11 between the silver electrode 18 on the second principal surface of the p-type silicon substrate 10 and the aluminum electrode 14 is removed by laser ablation to generate a junction separation portion 20.

Non-Patent Document 1: Filip Granek, A systematic approach to reduce process-induced shunts in back-contacted mc-Si solar cells, 4$^{th}$-WCPEC(2006), Hawaii In the MWT-type solar cell as shown in FIG. 6, the wider the surface area of the silver electrode 18 becomes, the better it is at the point of view of the mutual adhesion strength and a contact resistance thereof, because the silver electrode 18 must be connected to the inter-connector. Nonetheless, to widen the silver electrode 18, it is necessary to eliminate the aluminum electrode 14 at the portion of the silver electrode 18, and, in addition, generate the junction separation portion 20 around the silver electrode 18. Therefore, as the surface area of the silver electrode 18 is widened, the surrounding length of the junction separation portion 20 becomes longer so as to cause the problems that an insulating resistance may be reduced.

The reduction of the insulating resistance may cause the reduction of a fill factor (FF) in the solar cell characteristics. Further, as the surface area of the silver electrode 18 is widened, the surface area of the aluminum electrode 14 is reduced so that there are the problems that the surface area of the p+ layer 15 under the aluminum-silicon alloy is also reduced and Ise and Voc of the solar cell characteristics are reduced.

In view of the above-mentioned circumstances, it is a feature of the example embodiment presented herein to provide an improved photoelectric transducer as a solar cell with highly efficiency for improving an insulating resistance by shortening a surrounding length of a junction separation portion 20.

In order to solve the above problems, in a photoelectric transducer of the type where a light-receiving surface electrode is wired to another electrode on a back surface via a through electrode passing through a semiconductor substrate of a first conductive type, the photoelectric transducer of the present invention comprises a junction separation portion made around the through electrode on a back surface of the semiconductor substrate; a dielectric layer formed for covering the junction separation portion, the through electrode penetrating the dielectric layer; and a back electrode provided on the dielectric layer and coupled to the through electrode which is connected to the light-receiving surface electrode.

In the other words, a photoelectric transducer of the present embodiment comprises a semiconductor substrate of a first conductive type; a substrate through-hole penetrated through the semiconductor substrate; a semiconductor layer formed on a part of a light-receiving surface and a back surface of the semiconductor substrate, the semiconductor layer being of a second conductive type; a substrate conductive layer formed on the back surface of the semiconductor substrate, the substrate conductive layer having an opening portion for surrounding the substrate through-hole; a junction separation portion for electrically isolating the substrate conductive layer from the semiconductor layer, the junction separation portion being made around the substrate through-hole; a dielectric film formed on the back surface of the semiconductor substrate for covering the junction separation portion, the dielectric film having a dielectric-film through-hole successive to the substrate through-hole; a back electrode provided on the dielectric film, the back electrode being electrically connected to a though electrode passing through the substrate through-hole and the dielectric-film through-hole; and a light-receiving surface electrode provided on the light-receiving surface of the semiconductor layer, the light-receiving surface electrode being electrically coupled to the semiconductor layer and connected to the back electrode via the though electrode.

According to this construction, the surrounding length of the junction separation portion can be shortened to improve an insulating resistance. Further, the surface area of an aluminum electrode can be enlarged to improve a fill factor (FF), Ise, and Vco of the solar cell characteristics. Thereby, a solar cell with highly efficiency can be provided according to the present invention.

According to a specific embodiment of a photoelectric transducer, it is preferable that the back electrode have an outer diameter larger than the diameter of the junction separation portion. Hereby, the surrounding length of the junction separation portion can be shortened to improve an insulating resistance. At the same time, the outer diameter of the back electrode can be enlarged to enhance the mutual adhesion strength and minimize a contact resistance thereof in the case where it is connected to an inter-connector.

According to another specific embodiment of a photoelectric transducer, it is preferable that the dielectric film lies also on a part of the substrate conductive layer and that the outer diameter of the back electrode is larger than the diameter of the opening portion on the substrate conductive layer. Hereby, the outer diameter of the back electrode can be enlarged to enhance the mutual adhesion strength and minimize a contact resistance thereof in the case where it is connected to an inter-connector.

It is a feature of the present embodiment to provide a manufacture method for manufacturing a photoelectric transducer comprising the steps of: forming a substrate through-hole penetrating through a semiconductor substrate of a first conductive type; generating a semiconductor layer on the semiconductor substrate; forming a substrate conductive layer on the back surface of the semiconductor substrate except for the portion of the substrate through-hole; making a junction separation portion around the substrate through-hole on the back surface of the semiconductor substrate; forming a dielectric film on the back surface of the semiconductor substrate and the substrate conductive layer for covering the junction separation portion, the dielectric film having a dielectric-film through-hole successive to the substrate through-hole; providing a though electrode inside the substrate through-hole and the dielectric-film through-hole, and providing a back electrode on the dielectric film; and providing a light-receiving surface electrode on the light-receiving surface of the semiconductor layer, the light-receiving surface electrode being electrically coupled to the semiconductor layer and connected to the back electrode via the though electrode.

Hereby, a photoelectric transducer of the present embodiment can be manufactured.

According to the present embodiment, in the photoelectric transducer of the type where the light-receiving surface electrode is wired to the back surface via the substrate through-hole penetrated through in the silicon substrate, the back electrode is provided via the dielectric film above the junction separation portion made around the substrate through-hole in the back surface of the semiconductor substrate to shorten the surrounding length of the junction separation portion and to improve an insulating resistance.

Further, the surface area of the aluminum electrode constituting the substrate conductive layer can be enlarged to improve the performance of a solar cell. Thus, a solar cell with highly efficiency can be provided.

DESCRIPTION OF THE REFERENCE NUMERALS

Figure 1:
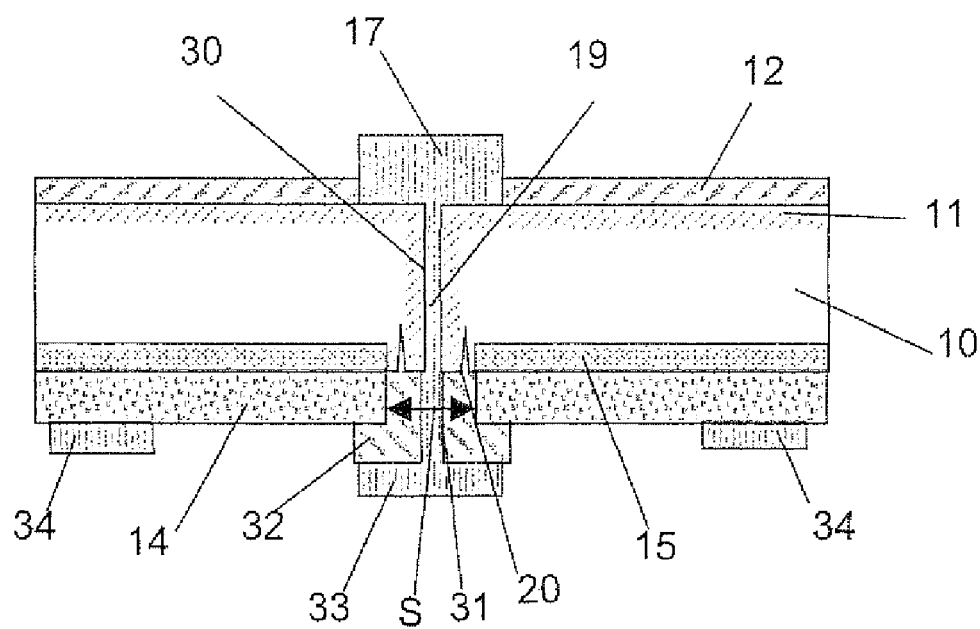
FIG. 1 is schematically a sectional view of a solar cell in accordance with an embodiment.

10: p-type silicon substrate
11: n+ layer
14: aluminum electrode
15: p+ layer
17: silver electrode
20: junction separation portion
30: first through hole
31: second through hole
32: dielectric layer
33: silver electrode
S: aluminum opening portion

DETAILED DESCRIPTION

Hereinafter, a preferred embodiment will be described.

FIG. 1 is schematically a sectional view of a solar cell as a photoelectric transducer in accordance with an embodiment. In the solar cell as shown in FIG. 1, a part of a light-receiving surface of a semiconductor substrate 10 of a first conductive type and a back surface thereof are doped with impurities to generate a front-surface semiconductor layer 11 of a second conductive type. A light-receiving surface electrode 17 is provided on a light-receiving surface of the front-surface semiconductor layer 11, the light-receiving surface electrode 17 being electrically coupled to the front-surface semiconductor layer 11. A substrate through-hole 30 is formed to penetrate through the semiconductor substrate 10, the substrate through-hole 30 leading the light-receiving surface electrode 17 to the back surface.

A substrate conductive layer 14 is formed on the back surface of the semiconductor substrate 10, the substrate conductive layer 14 including an opening portion S for surrounding the substrate through-hole 30. A junction separation portion 20 is made inside the opening portion S and around the substrate through-hole, the junction separation portion 20 serving to electrically isolate the substrate conductive layer 14 from the front-surface semiconductor layer 11. A dielectric film 32 is formed on the back surface of the semiconductor substrate 10 for covering the junction separation portion 20, the dielectric film 32 including a dielectric-film through-hole 31 successive to the substrate through-hole 30. A back-surface electrode 33 is provided on the dielectric film 32, the back-surface electrode 33 being electrically coupled to the light-receiving surface electrode 17 through a through electrode 19 passing through the substrate through-hole 30 and the dielectric-film through-hole 31.

Here, preferably, the outer diameter of the back-surface electrode 33 is larger than the diameter of the junction separation portion 20. Further, it is preferable that the dielectric film 32 lies also on a part of the substrate conductive layer 14, and that the outer diameter of the back-surface electrode 33 is larger than the diameter of the opening portion S on the substrate conductive layer 14.

The above-structured solar cell can be manufactured by the following steps, for example.

At first, a p-type silicon substrate 10 of a first conductive type is prepared on which surface a number of substrate through-holes 30 each with a diameter of 50 to 500 µm are penetrated by e.g. about several to several hundreds per unit surface area. Most preferably, the p-type silicon substrate 10 is a silicon crystal, but may be a polycrystal silicon or an amorphous silicon. The number of substrate through-holes 30 are formed by focusing and irradiating an YAG laser or CO2 laser.

Successively, the surface of the p-type silicon substrate 10 is etched with an alkali or an acid to remove a damaged layer (not shown) incurred in the case of slicing the p-type silicon substrate 10, and a thermally-damaged layer (not shown) incurred in the case of forming the substrate through-holes 30. In this time, by properly adapting the etching conditions, a fine uneven surface (not shown) of the p-type silicon substrate 10 can be made to thereby reduce surface reflecting loss.

Figure 2A:
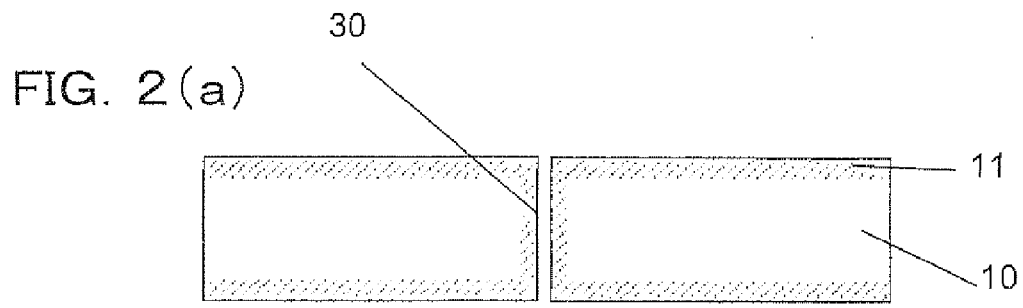
FIG. 2 is three earlier steps of explaining a manufacture method of a solar cell in accordance with an embodiment.

Successively, the p-type silicon substrate 10 is heat treated at a temperature of 800 to 950° C. for 5 to 30 minutes in a POC 13 vapor to create a n+ layer 11 of a second conductive type on the both surfaces of the p-type silicon substrate 10 and the inside walls of the substrate through-holes 30 (FIG. 2(a)). A pn junction is thus produced.

Instead of the above method, the n+ layer 11 can be created by coating a dopant liquid including a composite containing phosphorus and by heat treating it. Otherwise, the n+ layer 11 can be created by diffusion by the spray method.

Figure 2B:
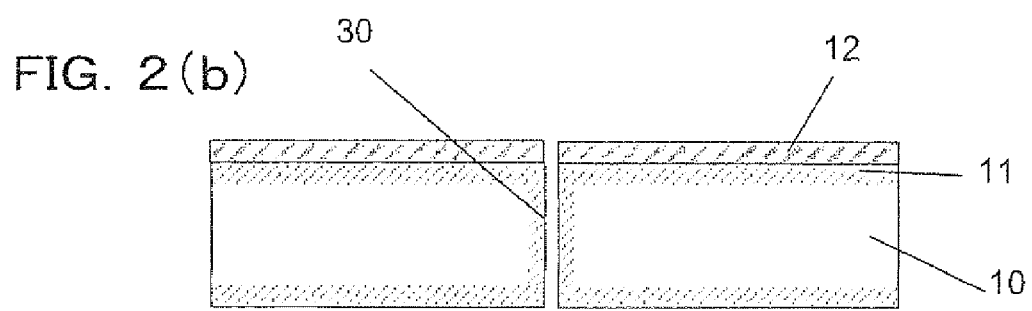

A glass layer may be caused on the both surfaces of the p-type silicon substrate 10 and the inside walls of the substrate through-holes 30 in the case of creating the n+ layer 11. In such a case, after the glass layer is removed by an acid treatment, an antireflection film 12 is generated on a light-receiving surface of the p-type silicon substrate 10, the light-receiving surface being referred to as a first principal surface (FIG. 2(b)). The antireflection film 12 is generated e.g. by depositing a silicon nitride film using the plasma CVD method.

Figure 2C:
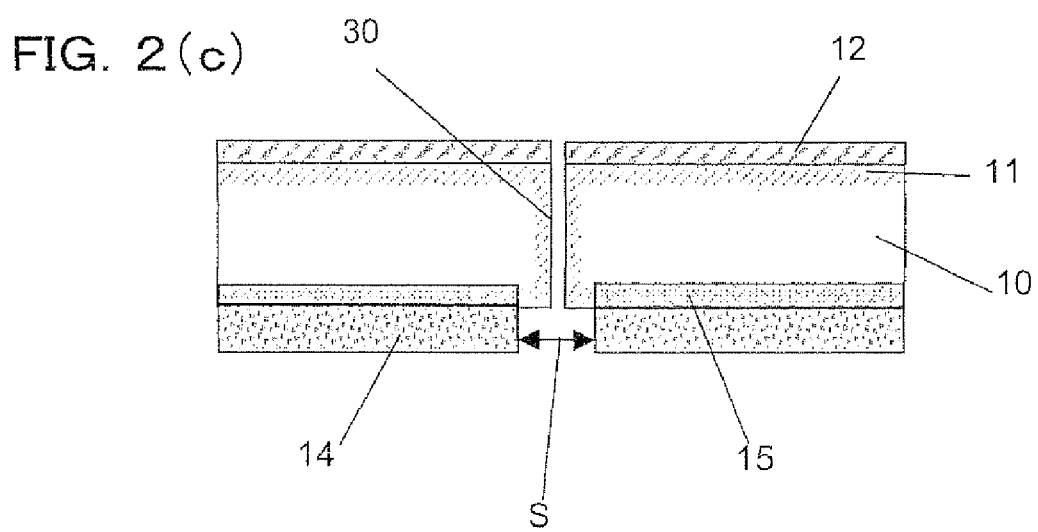

An aluminum electrode 14 is provided on a back surface of the p-type silicon substrate 10, the back surface being referred to as a second principal surface. The aluminum electrode 14 is provided entirely on the back surface (the second principal surface) except for the surrounding of the through-hole electrode 19 (the aluminum opening portion S), and a p+ layer 15 is created on the second principal surface of the p-type silicon substrate 10 (FIG. 2(c)). The aluminum electrode 14 is provided e.g. by printing, including a screen printing method, an aluminum paste containing aluminum powder, a glass frit, a synthetic resin, and an organic solvent on the p-type silicon substrate 10 and by heat treating the substrate 10. Further, the p+ layer 15 is created under an aluminum-silicon alloy layer (not shown) made by alloying aluminum in fusion and silicon.

Figure 3D:
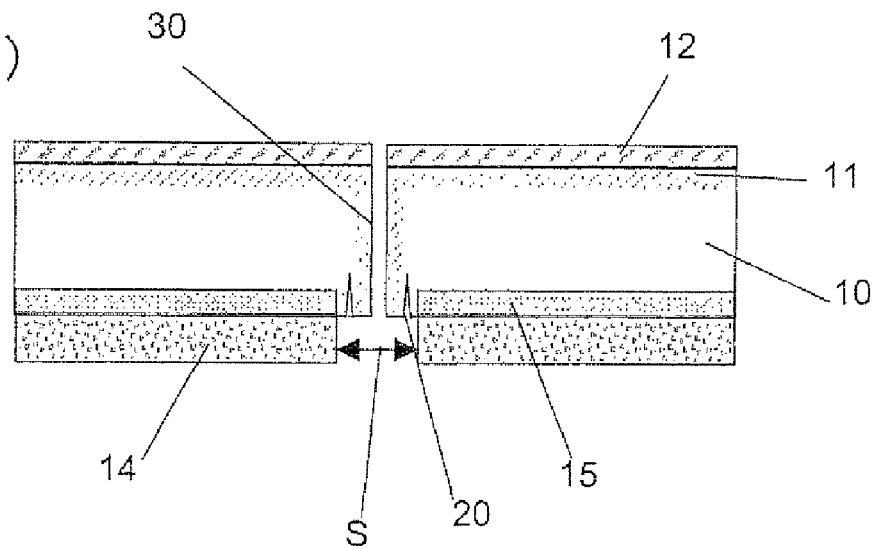
FIG. 3 is two successive steps of explaining a manufacture method of a solar cell in accordance with an embodiment.

Successively, laser ablation is applied to eliminate the n+ layer 11 formed from the back side of the p-type silicon substrate 10 and the surrounding of the substrate through-hole 30, namely, the aluminum opening portion S to make a junction separation portion 20 (FIG. 3(d)). The n+ layer 11 created at the periphery of the p-type silicon substrate 10 is eliminated by the laser ablation (not shown). Instead of the laser ablation, the n+ layer 11 can be eliminated by a sand-blast, an etching using an acid or alkali, or an etching using a plasma.

Figure 3E:
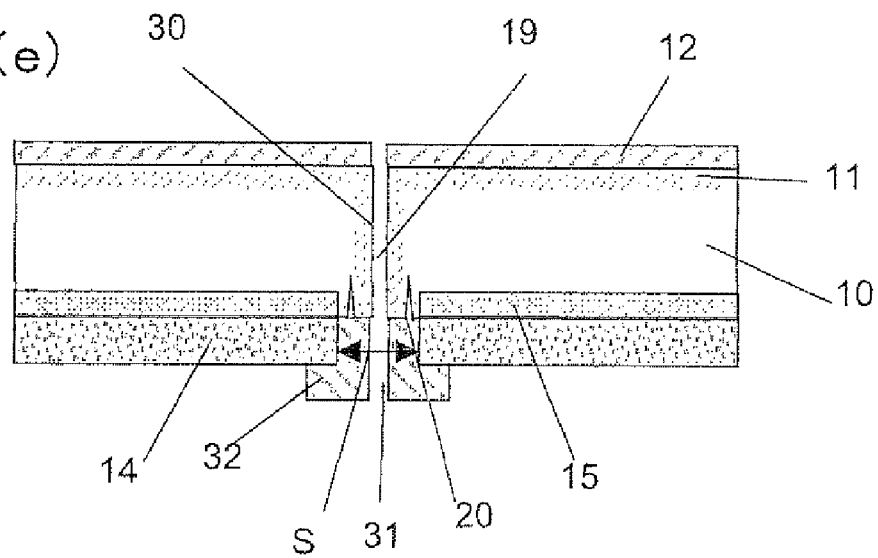

Next, a dielectric layer 32 is disposed except for the substrate through-hole 30 and on the junction separation portion 20 and the aluminum opening portion S on the back surface of the p-type silicon substrate 10, and on the portions including the aluminum electrode 14 around the aluminum opening portion S (FIG. 3(e)). Then, a dielectric-film through-hole 31 is formed to penetrate through the dielectric layer 32, the dielectric-film through-hole 31 being successive to the substrate through-hole 30. The dielectric layer 32 is formed e.g. by printing, including a screen printing method, a glass paste containing a glass frit, a synthetic resin, and an organic solvent on the p-type silicon substrate 10 and by heat treating the substrate 10. Otherwise, it can be formed by depositing a silicon oxide, a silicon nitride film or the like.

Figure 4F:
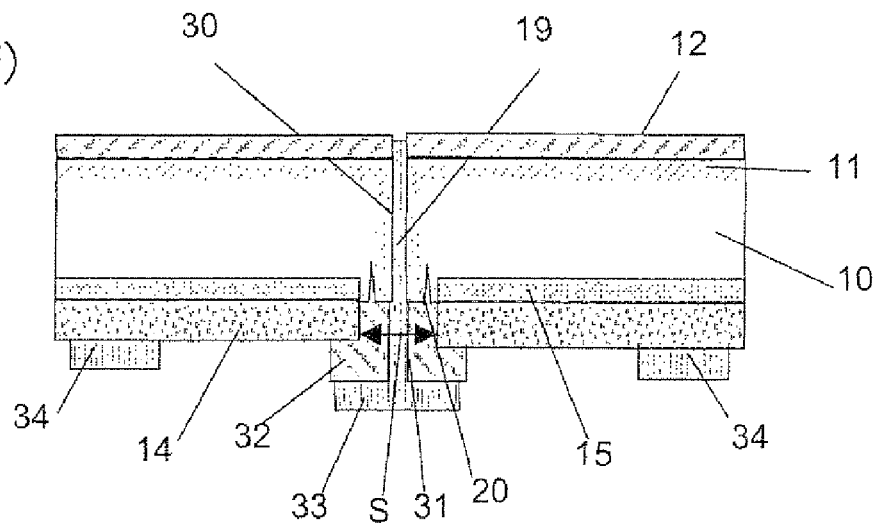
FIG. 4 is two further-successive steps of explaining a manufacture method of a solar cell in accordance with an embodiment.

Furthermore, a silver electrode 34 is provided on the back surface of the p-type silicon substrate 10, the silver electrode 34 being connected to an inter-connector. At the same time, a through electrode 19 is provided inside the substrate through-hole 30 and the dielectric-film through-hole 31, and a silver electrode 33 is formed on the dielectric layer 32 (FIG. 4(f)). The silver electrodes 33 and 34 can be provided e.g. by printing, including a screen printing method, a silver paste containing silver powder, a glass frit, a synthetic resin, and an organic solvent on the p-type silicon substrate 10 and by heat treating the substrate 10.

Figure 4G:
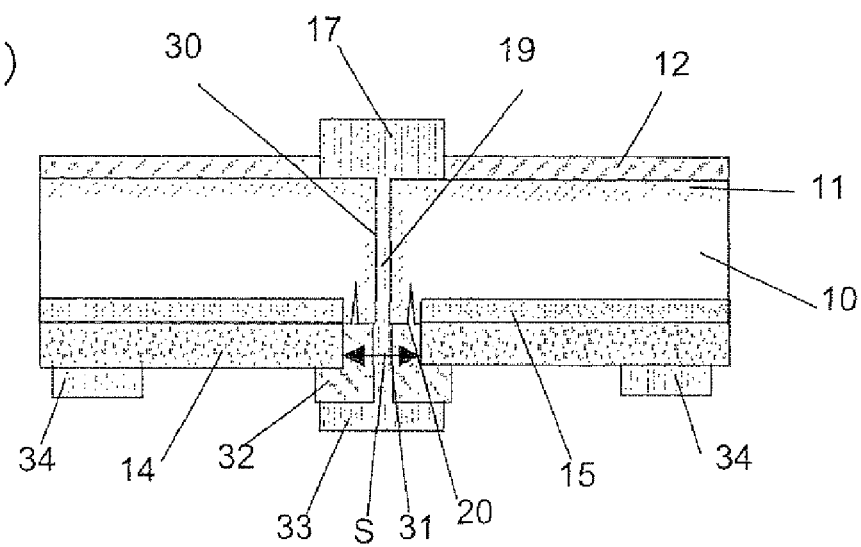
Figure 5:
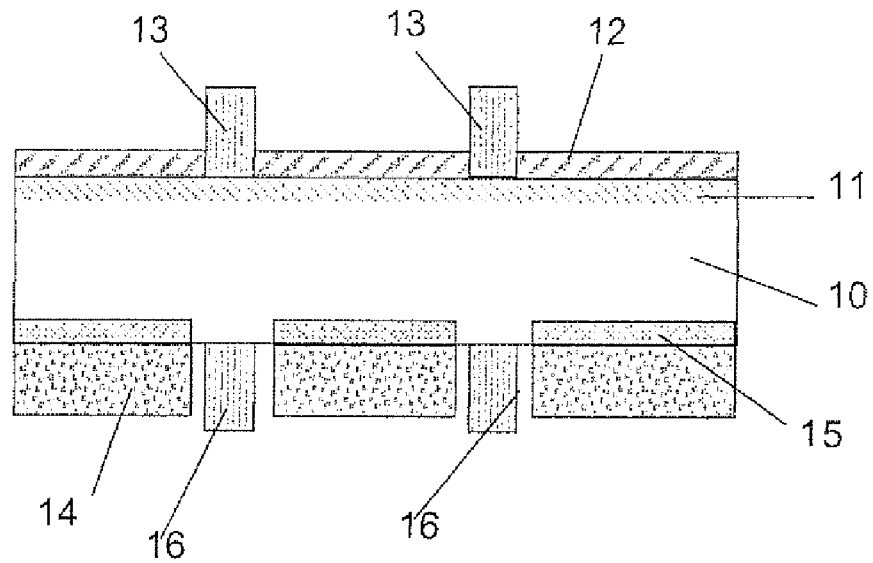
FIG. 5 is schematically a sectional view of a conventional solar cell.
Figure 6:
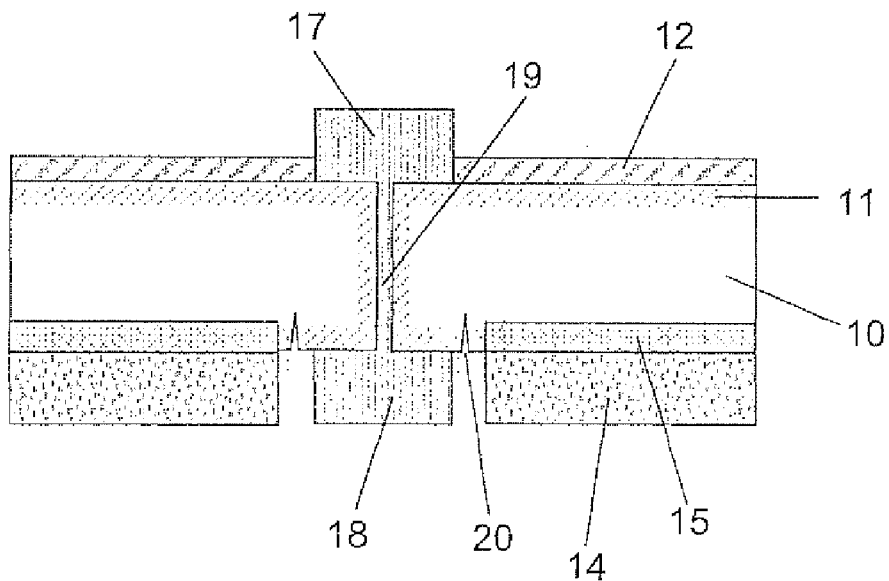
FIG. 6 is schematically a sectional view of a conventional solar cell.

Furthermore, a silver electrode 17 is generated on the light-receiving surface of the p-type silicon substrate 10 (FIG. 4(g)), the silver electrode 17 constituting as a light-receiving surface electrode in order to feed the power energy into the silver electrode 33 on the back surface through the through electrode 19 provided inside the substrate through-hole 30 and the dielectric-film through-hole 31. Thus, the silver electrode 17 on the light-receiving surface and the silver electrode 33 on the back surface are electrically coupled through the through electrode 19. The silver electrode 17 can be provided e.g. by printing, including a screen printing method, a silver paste containing silver powder, a glass frit, a synthetic resin, and an organic solvent on the antireflection film 12 and by heat treating the p-type silicon substrate 10. Hereby the silver paste can penetrate through the antireflection film 12 to permit the good electric contact with the n+ layer 11 on the first principal surface of the p-type silicon substrate 10 by the fire-through method.

As mentioned above, the solar cell as shown in FIG. 3 can be manufactured.

In the above description, the shape and the positioning relationship of each of the through electrode 19, the junction separation portion 20, the aluminum opening portion S, the dielectric layer 32, and the silver electrode 33 are assumed to be coaxial. Specifically, as an example, the diameter of the through electrode 19 is 0.3 mm, the diameter of the junction separation portion 20 is 1 mm, the diameter of the aluminum opening portion S is 2 mm, the diameter of the silver electrode 33 is 3 mm, and the diameter of the dielectric layer 32 is 4 mm.

However, the smaller the diameters of the junction separation portion 20 and the aluminum opening portion S are, the more they are desirable. Further, an embodiment of the present invention is featured in that the diameter of the silver electrode 33 is larger than that of each of the junction separation portion 20 and the aluminum opening portion S. In addition, it is unnecessary that the shape of each of the aluminum opening portion S, the junction separation portion 20, the dielectric layer 32, and the silver electrode 33 be always circle, and it is possible in the embodiment of the present invention that it is shaped a multi-corner figure such as a triangle to an eight-corner figure, or any arbitrary shape such as an oval. Even in the case of the arbitrary shape, the diameter may be larger in the order of the through electrode 19, the junction separation portion 20, and the aluminum opening portion S. Further, it is preferable that the diameter should be larger in the order of the silver electrode 33 and the dielectric layer 32.

Besides, the order of forming the silver electrode 17 on the light-receiving surface, the silver electrode 33 on the back surface, the aluminum electrode 14, the junction separation portion 20, and the dielectric layer 32 is exemplified only as an example, but not limited thereto.

According to the present embodiment, in the photoelectric transducer of the type where the light-receiving surface electrode is wired to the back surface via the substrate through-hole penetrated through in the silicon substrate, the back electrode is provided via the dielectric film above the junction separation portion caused around the substrate through-hole on the back surface of the semiconductor substrate to shorten the surrounding length of the junction separation portion and to improve an insulating resistance.

Further, the surface area of the aluminum electrode constituting the substrate conductive layer can be enlarged to improve the performance of a solar cell. Thus, a solar cell with highly efficiency can be provided.

The invention claimed is:

1. In a photoelectric transducer where a light-receiving surface electrode is wired to another electrode on a back surface via a through electrode passing through a semiconductor substrate of a first conductive type, the photoelectric transducer comprising:
    a junction separation portion made around the through electrode on a back surface of the semiconductor substrate;
    a dielectric layer formed on the back surface of the semiconductor substrate, the dielectric layer covering and filling the junction separation portion, the through electrode penetrating the dielectric layer; and
    a back electrode provided on the dielectric layer and coupled to the through electrode which is connected to the light-receiving surface electrode, wherein
    the junction separation portion is a recess formed in the back surface of the semiconductor substrate around the entire periphery of the through electrode.

2. A photoelectric transducer comprising:
    a semiconductor substrate of a first conductive type;
    a substrate through-hole penetrated through the semiconductor substrate;
    a semiconductor layer generated on a part of a light-receiving surface and a back surface of the semiconductor substrate, the semiconductor layer being of a second conductive type;
    a substrate conductive layer formed on the back surface of the semiconductor substrate, the substrate conductive layer having an opening portion for surrounding the substrate through-hole;
    a junction separation portion for electrically isolating the substrate conductive layer from the semiconductor layer, the junction separation portion being made around the substrate through-hole;
    a dielectric film formed on the back surface of the semiconductor substrate, the dielectric layer covering and filing the junction separation portion, the dielectric film having a dielectric-film through-hole successive to the substrate through-hole;
    a back electrode provided on the dielectric film, the back electrode being electrically connected to a though electrode passing through the substrate through-hole and the dielectric-film through-hole; and
    a light-receiving surface electrode provided on the light-receiving surface of the semiconductor layer, the light-receiving surface electrode being electrically coupled to the semiconductor layer and connected to the back electrode via the though electrode, wherein
    the junction separation portion is a recess formed in the back surface of the semiconductor substrate around the entire periphery of the substrate through-hole.

3. The photoelectric transducer according to claim 2, wherein
    the back electrode has an outer diameter larger than the diameter of the junction separation portion.

4. The photoelectric transducer according to claim 2, wherein
    the dielectric film lies also on a part of the substrate conductive layer and the outer diameter of the back electrode is larger than the diameter of the opening portion on the substrate conductive layer.

5. A manufacture method for manufacturing a photoelectric transducer comprising:
    forming a substrate through-hole penetrating through a semiconductor substrate of a first conductive type;
    generating a semiconductor layer on the semiconductor substrate;
    forming a substrate conductive layer on the back surface of the semiconductor substrate except for the portion of the substrate through-hole;
    making a junction separation portion around the substrate through-hole on the back surface of the semiconductor substrate;
    forming a dielectric film on the back surface of the semiconductor substrate and the substrate conductive layer, the dielectric layer covering and filling the junction separation portion, the dielectric film having a dielectric-film through-hole successive to the substrate through-hole;
    providing a though electrode inside the substrate through-hole and the dielectric-film through-hole, and providing a back electrode on the dielectric film; and
    providing a light-receiving surface electrode on the light-receiving surface of the semiconductor layer, the light-receiving surface electrode being electrically coupled to the semiconductor layer and connected to the back electrode via the though electrode, wherein
    the junction separation portion is a recess formed in the back surface of the semiconductor substrate around the entire periphery of the substrate through-hole.

6. The photoelectric transducer according to claim 2, wherein
    the back electrode is provided on the dielectric film covering at least a part of the junction separation portion, the back electrode being overlapped with the at least a part of the junction separation portion.

7. The photoelectric transducer according to claim 2, wherein
    the back electrode is provided on the dielectric film covering at least a part of the junction separation portion and a part of the substrate conductive layer, the back electrode being overlapped with the part of the substrate conductive layer.

* * * * *